United States Patent
Ho et al.

(10) Patent No.: US 10,431,526 B2
(45) Date of Patent: Oct. 1, 2019

(54) RIVETLESS LEAD FASTENING FOR A SEMICONDUCTOR PACKAGE

(71) Applicant: Infineon Technologies AG, Neubiberg (DE)

(72) Inventors: Kar Meng Ho, Ipoh (MY); Chiew Li Tai, Melaka (MY); Jia Yi Wong, Melaka (MY); Sanjay Kumar Murugan, Melaka (MY)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 15/727,725

(22) Filed: Oct. 9, 2017

(65) Prior Publication Data

US 2019/0109070 A1     Apr. 11, 2019

(51) Int. Cl.
| | |
|---|---|
| *H01L 23/492* | (2006.01) |
| *H01L 21/48* | (2006.01) |
| *H01L 23/14* | (2006.01) |
| *H01L 23/047* | (2006.01) |
| *H01L 23/31* | (2006.01) |
| *H01L 23/367* | (2006.01) |

(52) U.S. Cl.
CPC .......... *H01L 23/492* (2013.01); *H01L 21/481* (2013.01); *H01L 21/4814* (2013.01); *H01L 23/047* (2013.01); *H01L 23/14* (2013.01); *H01L 23/315* (2013.01); *H01L 23/367* (2013.01); *H01L 2224/48091* (2013.01); *H01L 2224/48137* (2013.01); *H01L 2224/48139* (2013.01); *H01L 2224/49111* (2013.01)

(58) Field of Classification Search
CPC .. H01L 23/492; H01L 21/481; H01L 21/4814
See application file for complete search history.

(56) References Cited

U.S. PATENT DOCUMENTS

| | | | |
|---|---|---|---|
| 3,784,884 A * | 1/1974 | Zoroglu | H01L 23/66 257/664 |
| 2007/0090515 A1* | 4/2007 | Condie | H01L 23/047 257/704 |
| 2007/0090542 A1 | 4/2007 | Condie et al. | |
| 2012/0051000 A1 | 3/2012 | Laidig et al. | |
| 2012/0067871 A1* | 3/2012 | Sherrer | C23C 24/082 219/678 |
| 2014/0103508 A1 | 4/2014 | Herbsommer | |
| 2014/0306329 A1 | 10/2014 | Takagi | |
| 2017/0278763 A1 | 9/2017 | Li et al. | |

OTHER PUBLICATIONS

Mohd, Bajuri K. et al., "Semiconductor Package with Heat Slug and Rivet Free Die Attach Area", Specification of U.S. Appl. No. 15/412,108, filed Jan. 23, 2017, pp. 1-40.

* cited by examiner

*Primary Examiner* — Errol V Fernandes
(74) *Attorney, Agent, or Firm* — BakerHostetler

(57) ABSTRACT

A metal heat slug having an upper and lower surface is provided. First and second electrically conductive leads are provided. First and second electrically insulating fastening mechanisms are provided. The first and second fastening mechanisms are adhered to the upper surface of the heat slug in an outer peripheral region of the heat slug such that the first and second leads are vertically separated from and electrically insulated from the heat slug. The central die attach region is exposed from the first and second fastening mechanisms after adhering the first and second fastening mechanisms to the upper surface of the heat slug.

21 Claims, 21 Drawing Sheets

RIVETLESS LEAD FASTENING FOR A SEMICONDUCTOR PACKAGE

TECHNICAL FIELD

The present invention generally relates to semiconductor device packaging and more particularly relates to methods of forming a semiconductor package with a thermally conductive heat slug and a corresponding package structure.

BACKGROUND

Semiconductor packages are commonly used to house and protect integrated circuits, such as amplifiers, controllers, ASIC devices, sensors, etc. In a semiconductor package, an integrated circuit (or circuits) is mounted to a substrate. The semiconductor package typically includes an electrically insulating encapsulant material, such as plastic or ceramic, that seals and protects the integrated circuits from moisture and dust particles. Electrically conductive leads that are connected to the various terminals of integrated circuits are accessible outside the semiconductor package.

In some package designs, the package includes a so-called "heat slug" or "heat sink." A package level heat slug is designed to pull heat away from the integrated circuits and toward an external heat sink. Typically, the heat slug is formed from a thermally conductive material (e.g., metal). In some package configurations, the heat slug also serves as an electrical terminal that provides a reference potential (e.g., ground) to the dies that are mounted thereon.

One semiconductor package design is a so-called "open air-cavity" ceramic package. According to this configuration, a ceramic lid is placed over a metal heat slug. The ceramic lid seals an open-air cavity that includes the integrated circuit (or circuits) and associated electrical connections. Another semiconductor package design is a so-called molded plastic design. According to this configuration, plastic material is molded (e.g., by injection or transfer molding) directly on to the heat slug to form a solid structure that directly contacts and encapsulates the integrated circuit (or circuits) and associated electrical connections as well as the heat slug.

The above mentioned open air-cavity ceramic package offers several notable performance advantages in comparison to the molded plastic design. One advantage stems from the fact that the dielectric constant of ambient air in the open-air cavity design is lower than the dielectric constant of the molded plastic material in the molded plastic design. The lower dialectic constant of air reduces capacitive effects, thereby providing lower power consumption and higher efficiency in comparison to the molded plastic design. Another advantage stems from the fact that the loss tangent of ambient air is zero whereas the loss tangent of the molded plastic material is non-negligible. Thus, the open air-cavity ceramic package provides greater RF isolation in comparison to the molded plastic design. Another advantage stems from the fact that the molding process required to form the molded plastic package requires the molding material to be formed around the outer edge sides and a portion of the bottom side of the heat slug so that the molded plastic will remain intact. By comparison, in the open-cavity ceramic design, the ceramic lid can be placed directly on top of the heat slug. As a result, the heat slug can be maximally widened to be coextensive with the outer boundaries of the package. Thus, the open air-cavity ceramic package provides lower impedance and inductance in comparison to the molded plastic design, due to the different footprints of the heat slug in the two designs.

On the other hand, the open air-cavity ceramic package is more expensive than the molded plastic design. One reason for this is that the leads of the open air-cavity ceramic package are attached to the heat slug using a high temperature brazing process. This process is very time consuming and consequently reduces throughput. The molded plastic design on the other hand utilizes a lead frame concept wherein a lead frame that includes the package leads connected to an outer frame is placed around the heat slug. Metal rivets are used to secure the outer frame of the lead frame unit lead frame to the heat slug. After die attach and wire bonding, the plastic encapsulant material is molded around the heat slug and the leads, Subsequently, the leads are trimmed from the outer frame. Although this packaging technique is relatively inexpensive in comparison to the "open-cavity" ceramic packaging technique, the rivets used in the molded plastic design nonetheless represent a substantial contributor to the overall packaging cost. Moreover, the rivets used in the molded plastic design occupy a significant amount of area on the heat slug and detrimentally impact the space efficiency of the design.

SUMMARY

A method of packaging a semiconductor device is disclosed. According to an embodiment of the method, a metal heat slug having an upper and lower surface is provided. First and second electrically conductive leads are provided. First and second electrically insulating fastening mechanisms are provided. The first and second fastening mechanisms are adhered to the upper surface of the heat slug in an outer peripheral region of the heat slug such that the first and second leads are vertically separated from and electrically insulated from the heat slug. The central die attach region is exposed from the first and second fastening mechanisms after adhering the first and second fastening mechanisms to the upper surface of the heat slug.

A semiconductor device package is disclosed. According to an embodiment of the semiconductor device package, a metal heat slug has an upper and lower surface, first and second electrically conductive leads, and first and second electrically insulating fastening mechanisms. The first and second electrically insulating fastening mechanisms respectively affix the first and second electrically conductive leads to the heat slug such that the first and second leads are vertically separated from and electrically insulated from the heat slug. The first and second electrically insulating fastening mechanisms are adhered to the upper surface of the heat slug in an outer peripheral region of the heat slug, the outer peripheral region surrounding a central die attach region. The central die attach region is uncovered from the first and second fastening mechanisms.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 1A and 1B, depicts a semiconductor device package with a non-metal lead fastening mechanism, according to an embodiment. FIG. 1A depicts a cross-sectional view of the package and FIG. 1B depicts a plan view of the heat slug.

FIGS. 2A and 2B, depicts a semiconductor device package with a non-metal lead fastening mechanism, according to another embodiment. FIG. 2A depicts a cross-sectional view of the package and FIG. 2B depicts a plan view of the heat slug.

FIGS. 3A, 3B and 3C, depicts a semiconductor device package with a non-metal lead fastening mechanism, according to another embodiment. FIG. 3A depicts a cross-sectional view of the package, FIG. 3B depicts a plan view of the heat slug, according to one embodiment, and FIG. 3C depicts a plan view of the heat slug, according to another embodiment.

FIGS. 4A and 4B, depicts a semiconductor device package with a non-metal lead fastening mechanism, according to another embodiment. FIG. 3A depicts a cross-sectional view of the package and FIG. 3B depicts a plan view of the heat slug.

FIGS. 10A and 10B, illustrates a first method step for forming the semiconductor package described with reference to FIG. 1, according to another embodiment. FIG. 10A illustrates a heat slug disposed in a metal carrier and FIG. 10B illustrates an exemplary lead frame that is placed on the outer walls of the metal carrier.

DETAILED DESCRIPTION

Embodiments to be described herein describe a semiconductor device package and corresponding semiconductor packaging technique that utilizes non-metal fastening mechanisms to securely affix the leads to the heat slug during the package assembly process. In some embodiments, the non-metal fastening mechanisms are provided by molded plastic structures that are adhered to the upper surface of the heat slug. These molded plastic structures envelop and physically support the leads. In other embodiments, the non-metal fastening mechanisms are provided by adhesive polymers that are provided beneath the leads. In either case, after securing the leads to the heat slug using the non-metal fastening mechanisms, wire bonding between the semiconductor dies and package leads can be performed with the non-metal fastening mechanism physically supporting the leads. Subsequently, a protective structure can be formed or completed so as to enclose the semiconductor die and the electrical connections.

By using the non-metal fastening mechanisms according to the techniques described herein, numerous advantages are realized. For example, because these techniques do not require a metal rivet to securely affix the leads to the heat slug, a substantial cost driver is eliminated from the package design. Moreover, the non-metal fastening mechanisms enable advantageous electrical performance of the packaged semiconductor device through structural features that were not possible in the prior art. For example, in some embodiments, the non-metal fastening mechanisms are part of a plastic molded structure that provides an open air-cavity package configuration. Thus, the above described benefits of the open-cavity ceramic package design, including utilizing the dielectric constant of ambient air, which leads to improved power efficiency and reduced loss tangent, and extension of the heat slug to the package edge, which leads to improved lower impedance and inductance, are realized. Meanwhile, detrimental aspects of the open-cavity ceramic design including the costly high temperature brazing process are eliminated by the use of the non-metal fastening mechanism.

Figure 1:
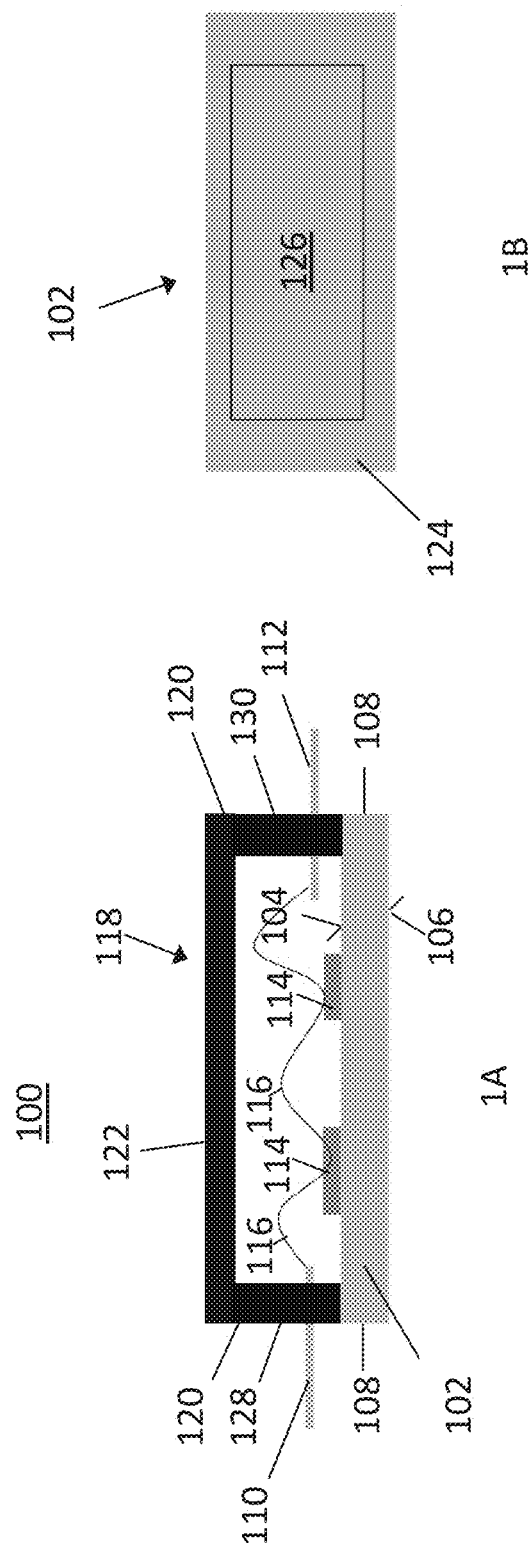
FIG. 1, which includes

Referring to FIG. 1, a semiconductor device package 100 is depicted, according to an embodiment. The semiconductor device package 100 includes a metal heat slug 102. The metal heat slug 102 has an upper surface 104, a lower surface 106 that is opposite the upper surface 104, and outer edge sides 108 extending between the upper and lower surfaces 104, 106. Each of the upper and lower surfaces 104, 106 may be, but are not necessarily, generally planar. The material of the heat slug 102 can include a wide variety of thermally and electrically conductive materials, such as copper, aluminum, and alloys thereof.

The semiconductor device package 100 additionally includes a plurality (i.e., two or more) of electrically conductive leads. In the depicted embodiment, the semiconductor device package 100 includes a first lead 110 extending away from one side of the package and a second lead 112 extending away from a second side of the package in an opposite direction as the first lead 110. Generally speaking, the number, size and geometry of leads can vary. Moreover, the semiconductor device package 100 can be configured according to any of a wide variety of lead designs (e.g., bent lead, flat package, etc.). The leads can include any of a wide variety of electrically conductive materials, such as copper, aluminum, and alloys thereof.

The semiconductor device package 100 additionally includes at least one semiconductor die mounted on the upper surface 104 of the heat slug 102. In the depicted embodiment, the semiconductor device includes two semiconductor dies 114. More generally, the semiconductor device package 100 can include any number of semiconductor dies 114. The semiconductor dies 114 can be configured as transistor dies, e.g., MOSFETs (metal-oxide semiconductor field-effect transistor), LDMOS (laterally-diffused metal-oxide semiconductor) devices, or HEMT (high electron mobility transistor) devices, etc. These transistor dies can be configured as vertical devices, with a reference terminal (e.g., a source terminal) that directly faces the heat slug 102 and makes direct electrical contact with the heat slug 102. Alternatively, these transistor dies can be configured as lateral devices that are configured to conduct in a lateral direction that is parallel to the upper surface 104 of the heat slug 102. In addition, the semiconductor dies 114 can be configured as passive devices, e.g., chip capacitors.

Conductive electrical connections 116 electrically connect terminals of the semiconductor dies 114 to the first and second leads 110, 112. In the depicted embodiment, these electrical connections 116 are provided by electrically conductive bond wires. The number and configuration of the bond wires may vary. More generally, any of a variety of commonly known electrical connection techniques, such as ribbon or conductive metallization, may also be used to complete these electrical connections 116.

The semiconductor device package 100 additionally includes a protective structure 118 that encloses the semiconductor dies 114 and the electrical connections 116. In the depicted embodiment, the protective structure 118 includes outer walls 120 and a roof section 122 that extends between the outer walls 120. The outer walls 120 formed an angled intersection with the roof section 122. The angled intersection can be roughly perpendicular (e.g., as shown) or more generally any obtuse angle. Thus, the outer walls 120 and the roof section 122 surround a three-dimensional volume. The protective structure 118 is disposed on the heat slug 102 such that the outer walls 120 of the protective structure 118 are disposed on an outer peripheral region 124 of the heat slug 102. The outer peripheral region 124 of the heat slug 102 is identified in FIG. 1B. The outer peripheral region 124 refers to a region of the heat slug 102 that extends around the perimeter of the heat slug 102. The outer peripheral region 124 surrounds and encloses a central die attach region 126 of the heat slug 102. The outer walls 120 of the protective structure 118 are disposed on the outer peripheral region 124, leaving the central die attach region 126 for the placement of the semiconductor dies 114 and the associated electrical connections.

Due to the configuration of the protective structure 118, an open air-cavity package configuration is realized. That is, the semiconductor dies 114 and the electrical connections 116 are disposed within a sealed air cavity between the protective structure 118 and the heat slug 102.

Generally speaking, the protective structure 118 can include any of a wide variety of electrically insulating materials. According to an embodiment, the protective structure 118 is formed from plastic. Exemplary plastic materials for the protective structure 118 include any plastics that are suitable for molding processes, e.g., epoxy resin polymer molding compounds.

In the embodiment of FIG. 1, the outer walls 120 of the protective structure 118 form fastening mechanisms that affix the first and second leads 110, 112 to the heat slug 102. More particularly, a first outer wall of the protective structure 118 provides a first fastening mechanism 128 that is adhered to the upper surface 104 of the heat slug 102 and consequently affixes the first lead 110 to the heat slug 102. Likewise, a second outer wall of the protective structure 118 that is opposite the first wall provides a second fastening mechanism 130 that is adhered to the upper surface 104 of the heat slug 102 and consequently affixes the second lead 112 to the heat slug 102. In each case, these fastening mechanisms 128, 130 physically support the first and second leads 110, 112 such that both of the first and second leads 110, 112 are vertically separated and electrically insulated from the heat slug 102.

One advantage of the semiconductor device package 100 is improved electrical performance in comparison to a molded plastic design. Whereas the dielectric constant of conventional plastic molding materials (e.g., G700 epoxy compound) is approximately 4.0, the ambient air surrounding the semiconductor dies 114 and electrical connections 116 in device package of FIG. 1 has a dielectric constant of 1.0. As a result, efficiency and power consumption is improved.

Figure 2:
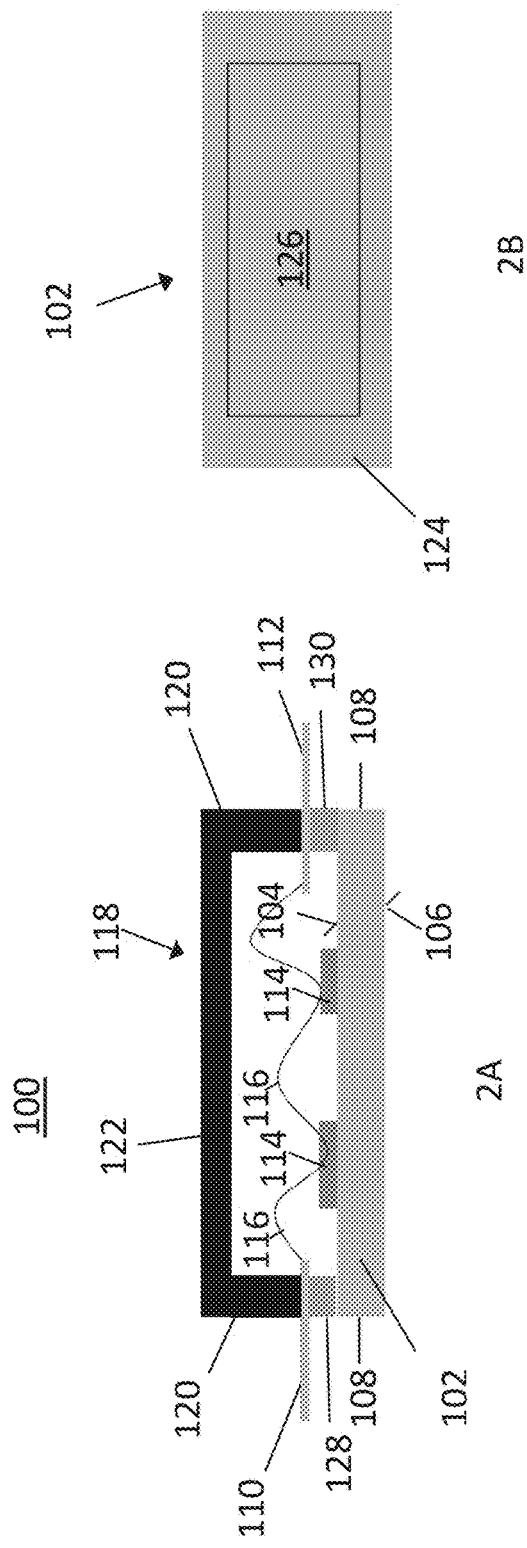
FIG. 2, which includes

Referring to FIG. 2, a semiconductor device package 100 is depicted, according to another embodiment. The semiconductor device package 100 of FIG. 2 is identical to the semiconductor device package 100 of FIG. 1, with the exception of the configuration of the protective structure 118 and the first and second fastening mechanisms 128, 130. In the embodiment of FIG. 2, the first and second fastening mechanisms 128, 130 are provided by adhesive polymers that are formed on the upper surface 104 of the heat slug 102. Generally speaking, these adhesive polymers can include any material that can form an adhesive bond between the heat slug 102 and the leads. Examples of these materials include silicone based polymers, e.g., (Wacker Semicosil 988 glue (Si Glue). According to an embodiment, the adhesive polymers are provided completely beneath the leads 110, 112. In particular, a first adhesive polymer that forms the first fastening mechanism 128 is disposed completely beneath the first lead 110 and a second adhesive polymer that forms the second fastening mechanism 130 is disposed completely beneath the second lead 112. A protective structure 118 is used to enclose the semiconductor dies 114 and the electrical connections 116. The protective structure 118 can be substantially similar to the protective structure 118 described with reference to FIG. 1, with the exception that there are no leads formed in the outer walls 120 of the protective cover. Instead, the outer walls 120 of the protective structure 118 are affixed to upper sides of the first and second leads 110, 112.

Figure 3:
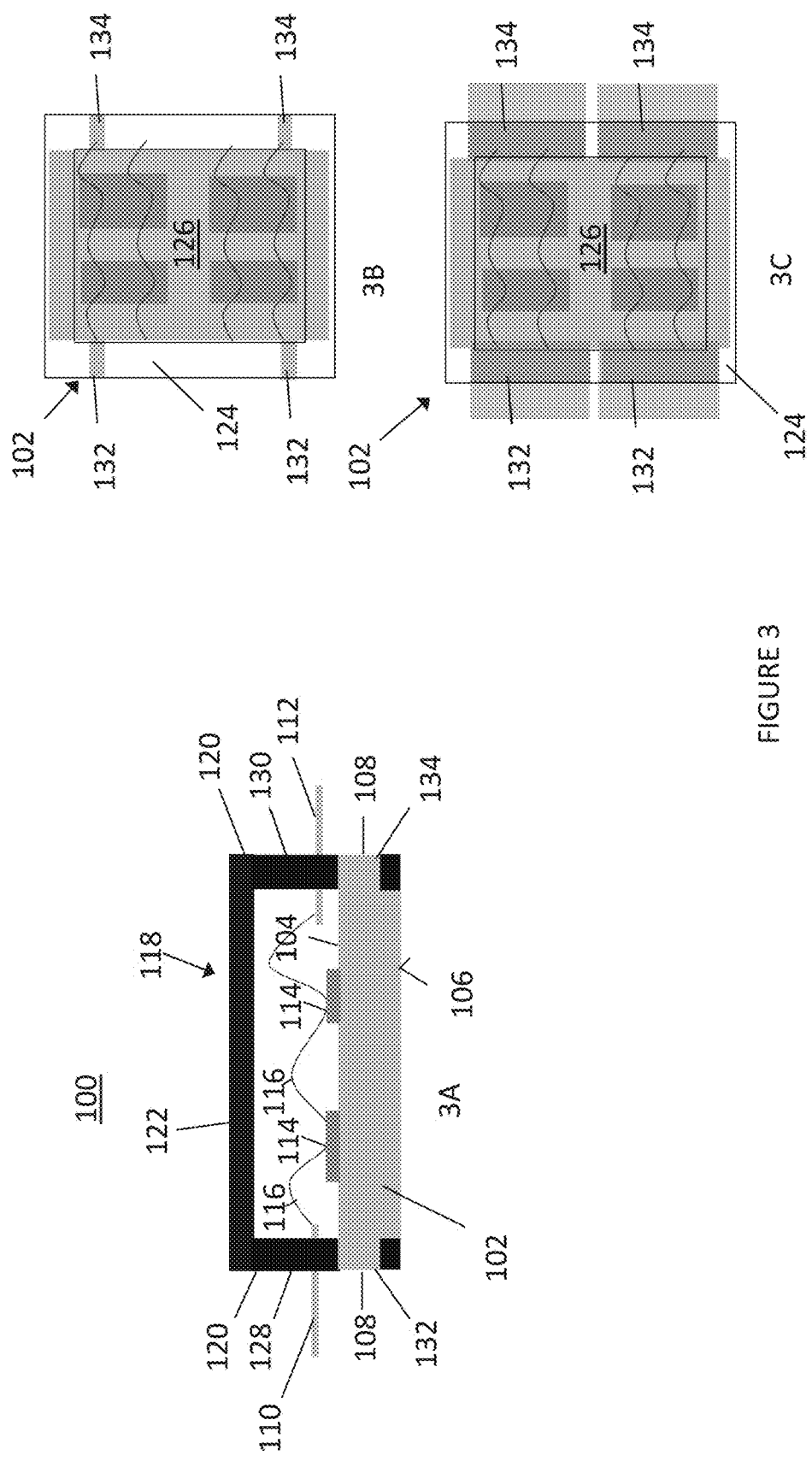
FIG. 3, which includes

Referring to FIG. 3, a semiconductor device package 100 is depicted, according to according to another embodiment. The semiconductor device package 100 of FIG. 3 is identical to the semiconductor device package 100 of FIG. 1 with the exception of the configuration of the heat slug 102 and the placement of the protective structure 118 on the heat slug 102. Whereas the heat slug 102 in the semiconductor device package 100 of FIG. 1 has completely linear outer edge sides 108, the heat slug 102 in the embodiment of FIG. 3 includes protrusions 132, 134 that extend away from the outer edge sides 108 of the heat slug 102.

Referring to FIG. 3A, a cross-sectional view of the semiconductor device package 100 with the protective structure 118 placed on the protrusions 132, 134 is depicted. According to one embodiment, the outer walls 120 of the protective structure 118 and outer ends of the protrusions 132, 134 are coextensive with one another. Thus, a flat outer boundary of the semiconductor device package 100 is provided by the protrusions 132, 134 and the outer walls 120 of the protective structure 118. In this way, electrical contact to the heat slug 102 along the side of the semiconductor device package 100 is possible.

Referring to FIG. 3B, one embodiment of the heat slug 102 is depicted. The heat slug 102 includes first and second outer edge sides 108 that are opposite from one another, a first protrusion 132 that extends away from the first outer edge side 108, and a second protrusion 134 that extends away from the second outer edge side 108. A possible outer peripheral region 124 for the placement of the protective structure 118 is identified in the figure. As can be seen, the first and second protrusions 132, 134 provide lateral extensions of the heat slug 102 for the placement of the protective structure 118. In this way, the available area on the upper surface 104 for attachment of semiconductor dies 114, etc. is maximized.

Referring to FIG. 3C, the heat slug 102 is depicted, according to another embodiment. The heat slug 102 of FIG. 3C is substantially identical to the heat slug 102 of FIG. 3B, with the exception that the width of the first and second protrusions 132, 134 has been matched to the width of the leads. An exemplary footprint for the package leads is superimposed on the figure. Generally speaking, the size, number and shape of protrusions 132, 134 can be adapted to match the size number and shape of the leads.

One advantage of the heat slug 102 configuration in the embodiment of FIG. 3 is improved electrical performance. Particularly in the embodiment of FIG. 3B, the areal overlap between the first and second leads 110, 112 and the heat slug 102 is substantially increased in comparison to designs that do not include the first and second protrusions 132, 134. This increases the capacitance between the leads and the heat slug 102, which can be used to reduce the overall impedance presented by the package by counteracting the inductance component of the reactance presented by the package.

Figure 4:
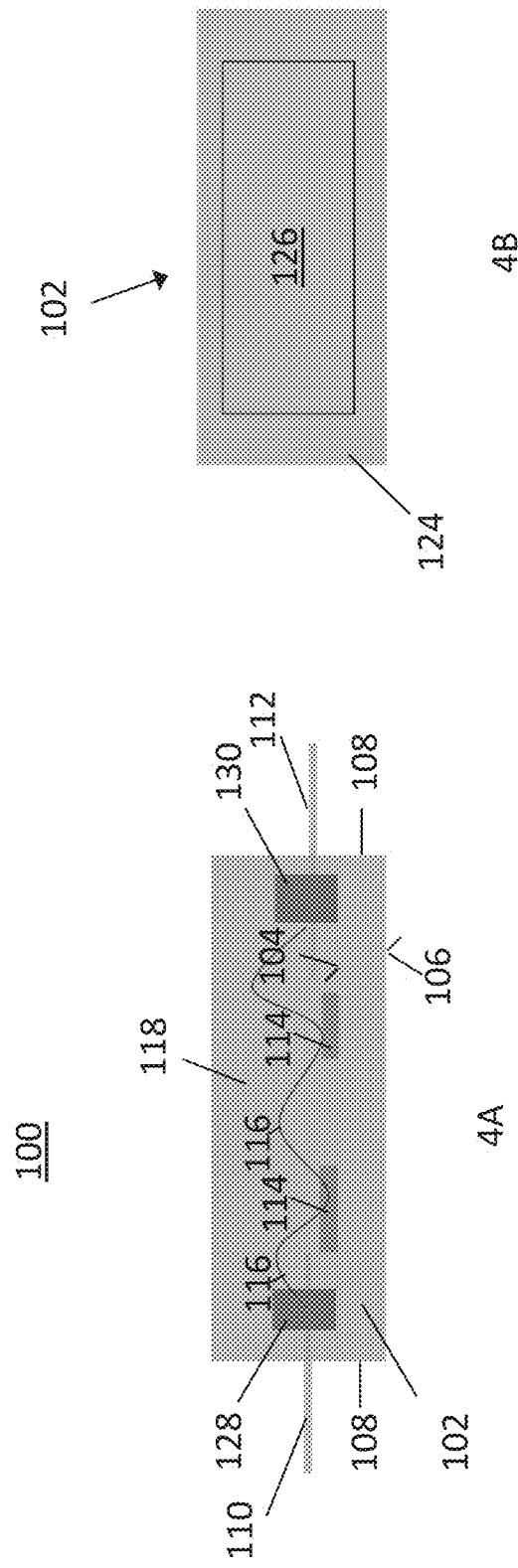
FIG. 4, which includes

Referring to FIG. 4, a semiconductor device package 100 is depicted, according to another embodiment. The semiconductor device package 100 of FIG. 4 is identical to the semiconductor device package 100 of FIG. 1, with the exception of the configuration of the protective structure 118 and the fastening mechanisms. The protective structure 118 of FIG. 4 is a solid structure that directly contacts and encapsulates the semiconductor dies 114 and the electrical connections 116. Thus, in contrast to the embodiment of FIG. 1, the embodiment of FIG. 4 does not have an open-air cavity design. The protective structure 118 can include any of a variety of insulating materials, including those materials that are suitable for a molding process, such as a thermosetting plastic. According to one embodiment, the protective structure 118 includes a low-k dielectric material with a low loss tangent. As used herein, a low-k dielectric material refers to any material with a dielectric constant of less than about 2.5. For example, the dielectric material may include a compound including Boron Nitride and Alumina Oxide. The low-k dielectric material advantageously improves the performance of the semiconductor device package 100 with respect to impedance and RF isolation in comparison to conventional epoxy molding compounds (e.g., G700), which are typically used in an injection molding process.

In the depicted embodiment, the first and second fastening mechanisms 128, 130 are incorporated into the protective structure 118, e.g., as described with reference to FIG. 1. Instead, the first and second fastening mechanisms 128, 130 are only used to keep the first and second leads 110, 112 in place during processing steps, including the die attach and wire bonding processes to be described in further detail below. Thus, the first and second fastening mechanisms 128, 130 can be formed as discrete plastic columns that are disposed only on a portion of the outer perimeter of the heat slug 102.

In the embodiment of FIG. 4, the first fastening mechanism 128 is provided by a first plastic column that envelops the first lead 110, and the second fastening mechanism 130 is provided by a second plastic column that envelops the second lead 112. Both of the first and second fastening mechanisms 128, 130 are adhered to different locations on the outer peripheral region 124 of the heat slug 102. The first and second fastening mechanisms 128, 130 may be mounted near the outer edge sides 108 of the heat slug 102. Alternatively, as shown in the figure, a separation distance may be provided between the first and second fastening mechanisms 128, 130 and the outer edges of the heat slug 102.

One advantage of the package design configuration in the embodiment of FIG. 4 is reduced cost in comparison to a conventional molded plastic design. In this design, the non-metal fastening mechanisms advantageously eliminate the cost and area requirement associated with a conventional riveting technique.

FIGS. 5-10 depict selected steps for forming the semiconductor device package 100 described with reference to FIG. 1, according to an embodiment.

Figure 5:
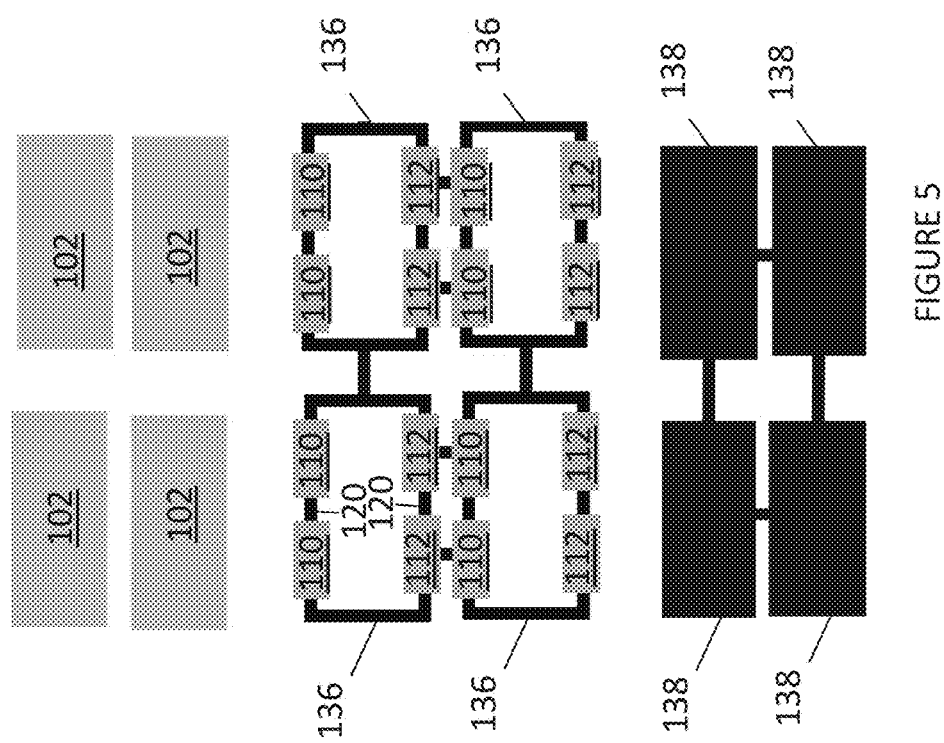
FIG. 5 illustrates a first method step for forming the semiconductor package described with reference to FIG. 1, according to an embodiment.

Referring to FIG. 5, various components of the semiconductor device package 100 are provided. In particular, a plurality of the heat slugs 102 is provided. In addition, a plurality of pre-molded plastic structures 136 is provided. In addition, a plurality of pre-molded plastic lids 138 is provided.

Each of the pre-molded plastic structures a formed in the shape of a ring. As used herein, a "ring" refers to any enclosed shape that surrounds a vacant interior region. A "ring" may have curves, but is not necessarily circular. The pre-molded plastic structures 136 provide the outer walls 120 of the protective structure 118. According to an embodiment, the geometry of the pre-molded plastic structures 136 corresponds to the shape of the outer perimeter of the heat slug 102. That is, the pre-molded plastic structure 136 is dimensioned such that the outer walls 120 of the protective structure 118 align with the outer walls 120 of the edge sides of the heat slug 102 (e.g., as depicted in FIG. 1) when the pre-molded plastic structure 136 is placed on the upper surface 104 of the heat slug 102.

The pre-molded plastic structures 136 include the first and second leads 110, 112 integrally formed in the outer walls 120 of the pre-molded plastic structures 136. That is, the plastic of the pre-molded plastic structures 136 directly contacts the first and second leads 110, 112 such that these items are physically coupled to one another.

The pre-molded plastic lids 138 are dimensioned and configured to be placed on top of the pre-molded plastic structures 136 so as to enclose an interior volume. That is, the pre-molded plastic lids 138 have the same basic geometry as the pre-molded plastic structures 136. Optionally, the pre-molded plastic lids 138 and/or the pre-molded plastic structures 136 may include features to retain the pre-molded plastic lids 138 on top of the pre-molded plastic structures 136. Exemplary retaining features include interlocking features, track and groove systems, etc.

Figure 6:
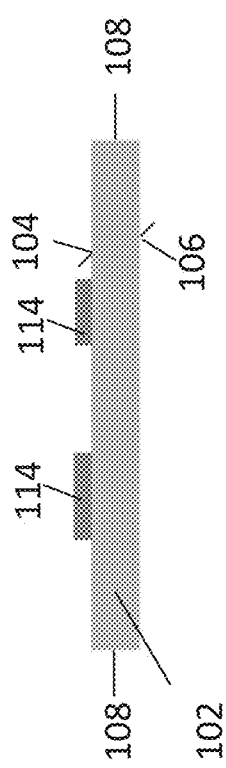
FIG. 6 illustrates a second method step for forming the semiconductor package described with reference to FIG. 1, according to an embodiment.

Referring to FIG. 6, after providing the heat slugs 102, one or more of the semiconductor dies 114 are affixed to the upper surface 104 of the heat slug 102. This can be done according to any of a variety of conventionally known techniques, e.g., soldering, sintering, adhesive tape, liquid adhesives, etc. According to one technique an AuSn (gold/tin) containing diffusion solder is used to physically couple and electrically connect the semiconductor dies 114 to the heat slug 102.

Figure 7:
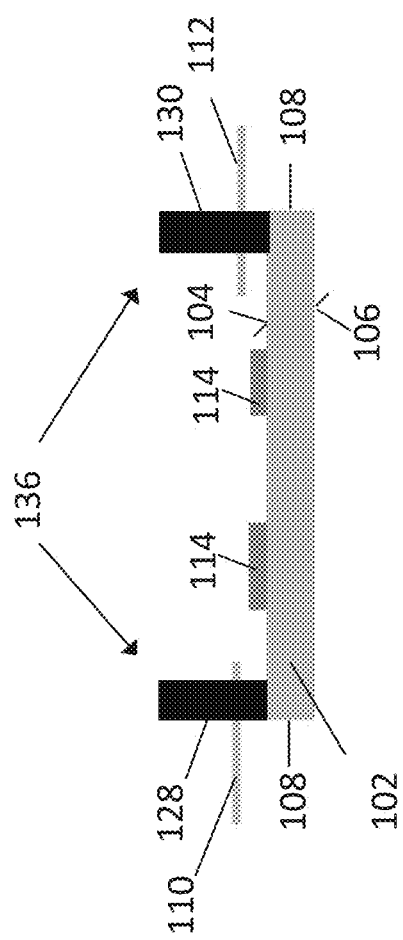
FIG. 7 illustrates a third method step for forming the semiconductor package described with reference to FIG. 1, according to an embodiment.

Referring to FIG. 7, the pre-molded plastic structures 136 are adhered to the upper surface 104 of the heat slug 102 in the outer peripheral region 124. Adhering the pre-molded plastic structures 136 to the upper surface 104 of the heat slug 102 can be done using any of a variety of adhesive materials that are suitable for forming a secure bond between the plastic material of the pre-molded plastic structures 136 and the metal material of the heat slug 102. Examples of these adhesive materials include adhesive polymers including silicon based glue or epoxy adhesive, e.g., wacker semicosil 988 glue (Si Glue). The first and second fastening mechanisms 128, 130 as previously described are provided by the outer walls 120 of the pre-molded plastic structures 136.

Figure 8:
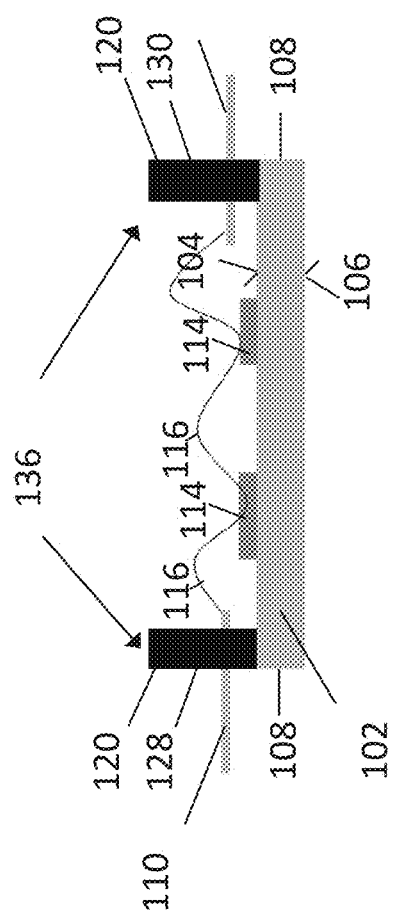
FIG. 8 illustrates a fourth method step for forming the semiconductor package described with reference to FIG. 1, according to an embodiment.

Referring to FIG. 8, after affixing the pre-molded plastic structures 136 and the semiconductor dies 114 to the upper surface 104 of the heat slug 102, the electrical connections 116 between the semiconductor dies 114 and the first and second leads 110, 112 are formed.

Figure 9:
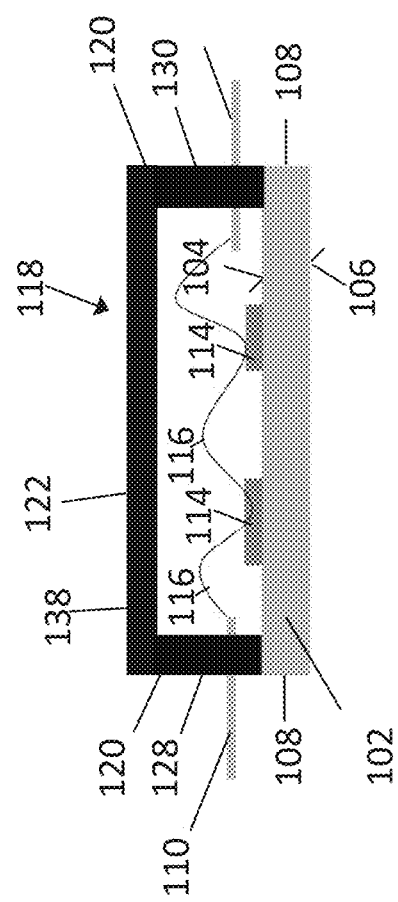
FIG. 9 illustrates a fifth method step for forming the semiconductor package described with reference to FIG. 1, according to an embodiment.

Referring to FIG. 9, after forming the electrical connections 116 between the semiconductor dies 114 and the first and second leads 110, 112, the pre-molded plastic lids 138 are placed on top of the pre-molded plastic structures 136. The pre-molded plastic lids 138 are securely attached to the pre-molded plastic structures 136 using any of a variety of adhesive materials, such as a silicone glue or epoxy passed adhesive, e.g., Wacker Semicosil 988 glue (Si Glue). As a result, the semiconductor dies 114 and the electrical connections 116 are enclosed by the protective structure 118. In this design, the pre-molded plastic structures 136 provide the outer walls 120 of the protective structure 118 and the pre-molded plastic lids 138 provide the roof section 122 of the protective structure 118 that extends between the outer walls 120 of the protective structure 118. Moreover, the semiconductor dies 114 and the electrical connections 116 are disposed within an air cavity that is between the protective structure 118 and the heat slug 102.

Advantageously, the pre-molded plastic structures 136 provide the non-metal first and second fastening mechanisms 128, 130 as previously described that are used to affix the first and second leads 110, 112 to the heat slug 102. By providing these first and second fastening mechanisms 128, 130 the first and second leads 110, 112 are held in place during the package assembly process. In particular, the first and second leads 110, 112 are held in place during the electrical connection process (e.g., wire bonding). As a result, no rivets are required to physically support the first and second leads 110, 112 during the package assembly process.

FIGS. 10-14 depict selected steps for forming the semiconductor device package 100 described with reference to FIG. 1, according to another embodiment. Different to the embodiment described with reference to FIGS. 5-9 wherein the first and second fastening mechanisms 128, 130 are provided from pre-molded plastic structures 136, the embodiments of FIGS. 10-14 describe a technique wherein the first and second fastening mechanisms 128, 130 are formed by performing an in-situ molding process directly on the heat slug 102.

Figure 10:
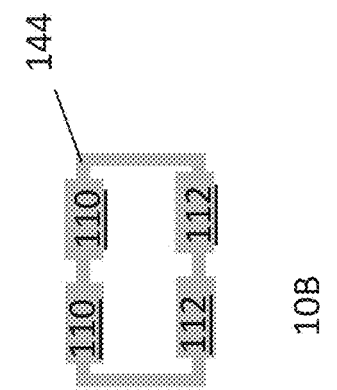
FIG. 10, which includes
Figure 10:
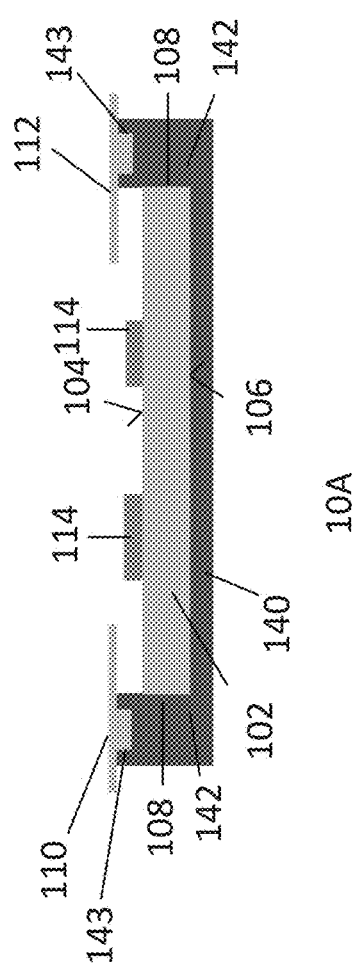

Referring to FIG. 10, a metal carrier 140 is provided in addition to the heat slug 102. In the depicted embodiment, the lower surface 106 of the heat slug 102 is supported by a central portion of the metal carrier 140 and outer walls 142 of the metal carrier 140 extend past the upper surface 104 of the heat slug 102. The metal carrier 140 is dimensioned to provide a receptacle that receives the heat slug 102 and securely retains the heat slug 102 in place.

After placing the heat slug 102 in the metal carrier 140, the first and second leads 110, 112 are placed on the outer walls 142 of the metal carrier 140. Thus, the outer walls 142 of the metal carrier 140 physically support the first and second leads 110, 112 and physically separate the first and second leads 110, 112 from the heat slug 102. The leads can be provided from a lead frame structure. An exemplary lead frame structure 144 is shown in FIG. 10B. Optionally, the metal carrier 140 may include a locking feature 143 on the outer walls 142 to ensure that the first and second leads 110, 122 are kept securely in place. Alternatively, external clamping mechanisms can be used. Alternatively, adhesives, such as adhesive tapes, can be used to securely retain the first and second leads 110, 112 against the outer walls 142 of the metal carrier 140.

Additionally, the semiconductor dies 114 are affixed to the heat slug 102. This can be done according the technique described with reference to FIG. 6, for example. This die attachment can occur before or after placement of the leads on the metal carrier 140.

Figure 11:
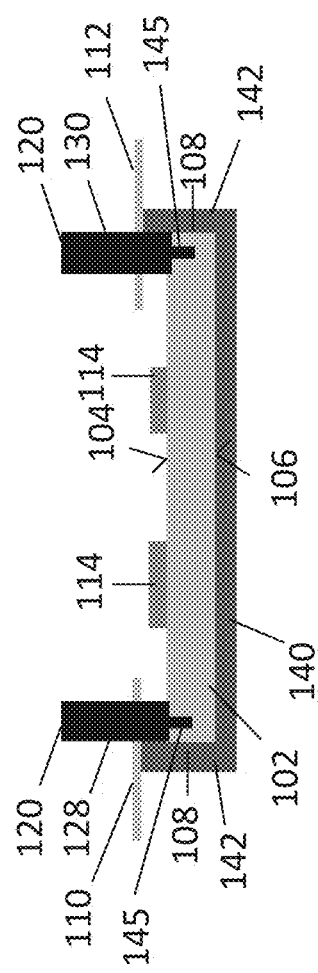
FIG. 11 illustrates a second method step for forming the semiconductor package described with reference FIG. 1, according to another embodiment.

Referring to FIG. 11, after placing the first and second leads 110, 112 on the outer walls 142 of the metal carrier 140, a molding process is performed. According to this process, plastic molding material is formed around the first and second leads 110, 112 so as to envelop the first and second leads 110, 112. The molding process can be carried out such that the molding compound is formed in the shape of an enclosed ring, e.g., as depicted and described with reference to FIG. 5. That is, the outer walls 120 of the protective structure 118 can be molded directly onto the hear slug. Alternatively, the molding process can be carried out to form the first and second fastening mechanism 128, 130 as discrete columns that are only disposed on portions of the outer peripheral region 124.

Generally speaking, the molding technique for forming the plastic structures in FIG. 11 can be any of a wide variety of molding techniques that are suitable for molding an electrical insulator (e.g., plastic) around the first and second leads 110, 112. Examples of these molding techniques include injection molding, transfer molding, etc.

Because the plastic is molded directly onto the heat slug 102, it directly adheres to the heat slug 102. Optionally, the heat slug 102 may include mold adhesion features 145 that enhance adhesion between the molded plastic of the protective structure 118 and the upper surface 104 of the heat slug 102. In the depicted embodiment, the mold adhesion features 145 have a generally rectangular shape. More generally, the mold adhesion features 145 can have any of a variety of geometries including curves, retrograde angles, triangles, etc., that enhance the adhesive bond between the molded plastic of the protective structure 118 and the heat slug 102. In some embodiments, the mold adhesion features 145 penetrate completely through the heat slug 102 so that the molded plastic of the protective structure 118 can adhere to the lower surface 106 of the heat slug 102.

Figure 12:
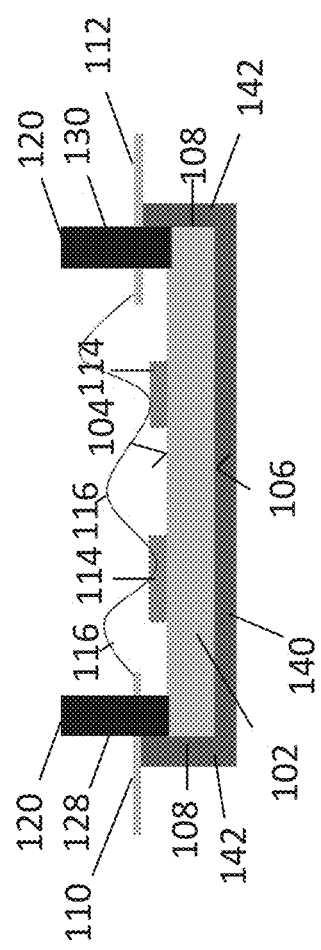
FIG. 12 illustrates a third method step for forming the semiconductor package described with reference to FIG. 1, according to another embodiment.

Referring to FIG. 12, the electrical connections 116 between the semiconductor die and the first and second leads 110, 112 are formed. These electrical connections 116 can be formed according to the techniques described with reference to FIG. 8, for example. In the depicted embodiment, these electrical connections 116 are formed after molding the first and second fastening mechanisms 128, 130, e.g., as described with reference to FIG. 11. Alternatively, these electrical connections 116 can be formed before molding the first and second fastening mechanisms 128, 130.

Figure 13:
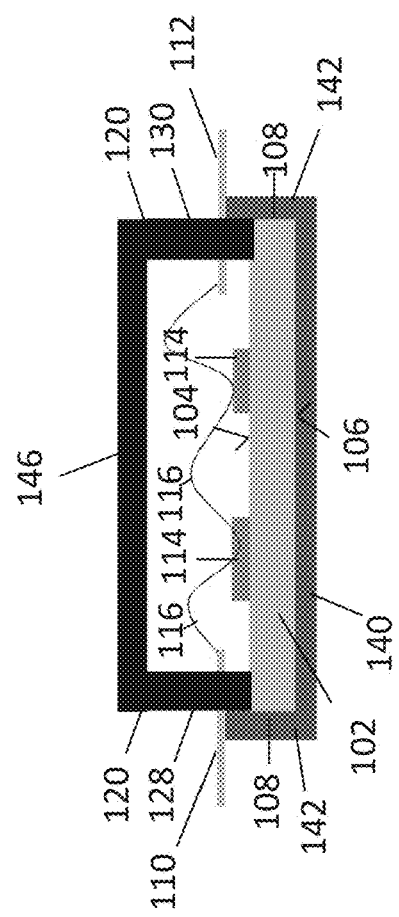
FIG. 13 illustrates a fourth method step for forming the semiconductor package described with reference to FIG. 1, according to another embodiment.

Referring to FIG. 13, after forming the outer walls 120 of the protective structure 118 and forming the electrical connections 116, a lid 146 is placed on the molded outer walls 120 of the protective structure 118. The lid 146 can be a pre-molded structure that is substantially similar or identical to the lid 138 described with reference to FIGS. 5 and 9. The lid 146 can be attached to the molded first and second fastening mechanisms 128, 130 using any of a variety of adhesive materials, such as a silicon glue or epoxy passed adhesive. According to another embodiment, a molding process is carried out to directly mold the lid onto the outer walls 120 of the protective structure 118. At any point in time after performing the molding process or processes, the metal carrier 140 can be removed.

Figure 14:
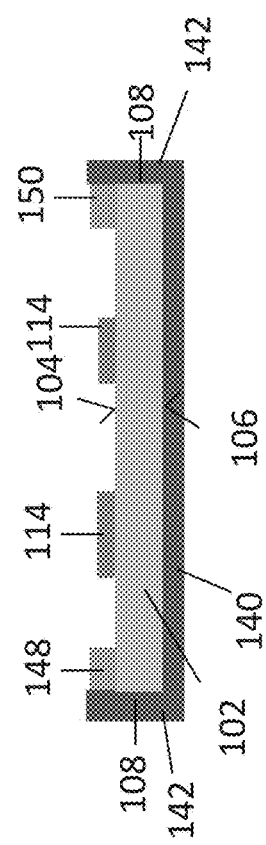
FIG. 14 illustrates a fifth method step for forming the semiconductor package described with reference to FIG. 2, according to an embodiment.
Figure 15:
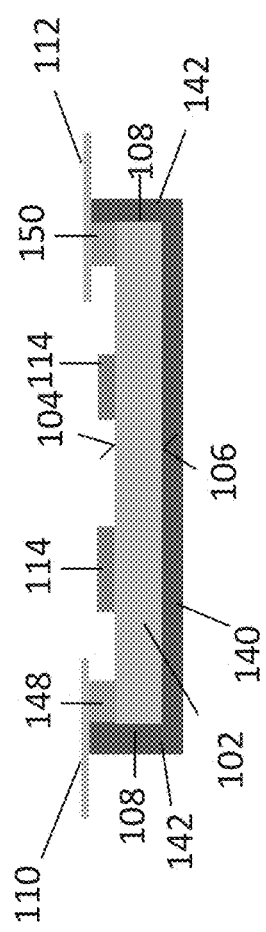
FIG. 15 illustrates a first method step for forming the semiconductor package described with reference to FIG. 2, according to an embodiment.
Figure 16:
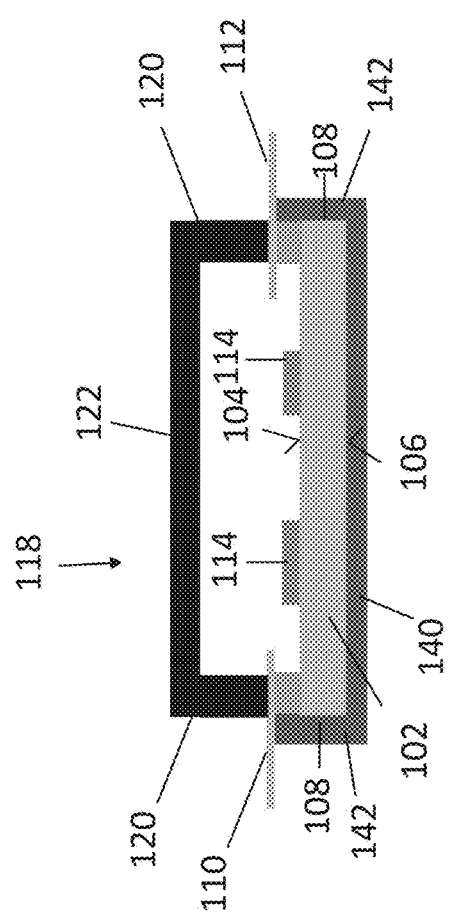
FIG. 16 illustrates a second method step for forming the semiconductor package described with reference to FIG. 2, according to an embodiment.

FIGS. 14-16 depict selected steps for forming the semiconductor device package 100 described with reference to FIG. 2, according to an embodiment.

Referring to FIG. 14, a heat slug 102 that is configured according to any of the embodiments described herein is provided within a metal carrier 140, e.g., in a similar manner as described with reference to FIG. 10. The semiconductor dies 114 are attached to the heart slug, e.g., in a similar manner as described with reference to FIG. 6. Prior to placing the first and second leads 110, 112 on the metal carrier 140, first and second adhesive polymer support structures 148, 150 are formed on the heat slug 102. These first and second adhesive polymer support structures 148, 150 can be formed in the outer peripheral region 124 of the heat slug 102.

Referring to FIG. 15, the first and second leads 110, 112 are placed on the outer walls 142 of the metal carrier 140 such that these first and second leads 110, 112 contact the first and second adhesive polymer support structures 148, 150. As a result, the first and second leads 110, 112 adhere to the first and second adhesive polymer support structures 148, 150. Moreover, the first and second adhesive polymer support structures 148, 150 provide physical support from beneath the first and second leads 110, 112.

Referring to FIG. 16, a protective structure 118 is placed on the first and second leads 110, 112. Different to the embodiments described with reference to FIGS. 5-13, in this embodiment, the outer walls 120 of the protective structure 118 do not envelop the first and second leads 110, 112. Instead, the protective structure 118 can be provided as a discrete structure that is placed on top of the first and second leads 110, 112. The protective structure 118 can be a pre-molded plastic structure having outer walls 120 and a roof section 122. The protective structure 118 is adhered to upper surfaces of the first and second leads 110, 112 using, e.g., a silicone based adhesive. As a result, the semiconductor dies 114 and the electrical connections 116 are enclosed in an open-air cavity in a similar manner as previously described.

Figure 17:
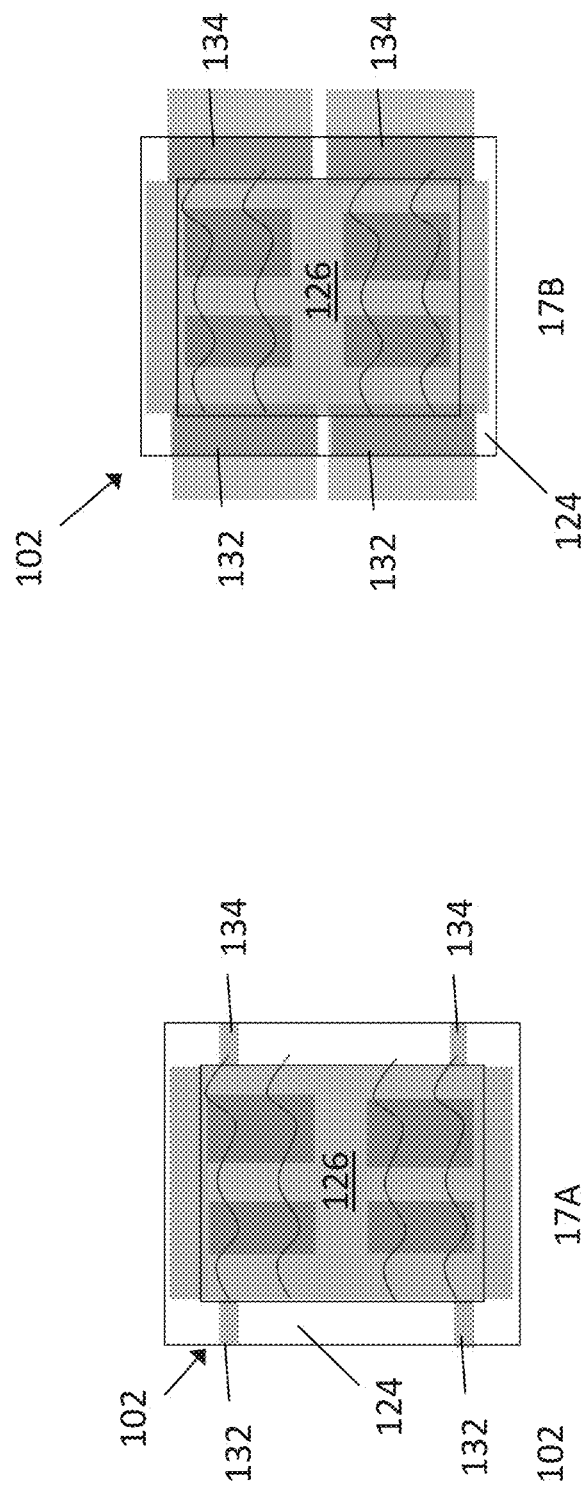
FIG. 17 illustrates a third method step for forming the semiconductor package described with reference to FIG. 3, according to an embodiment.
Figure 18:
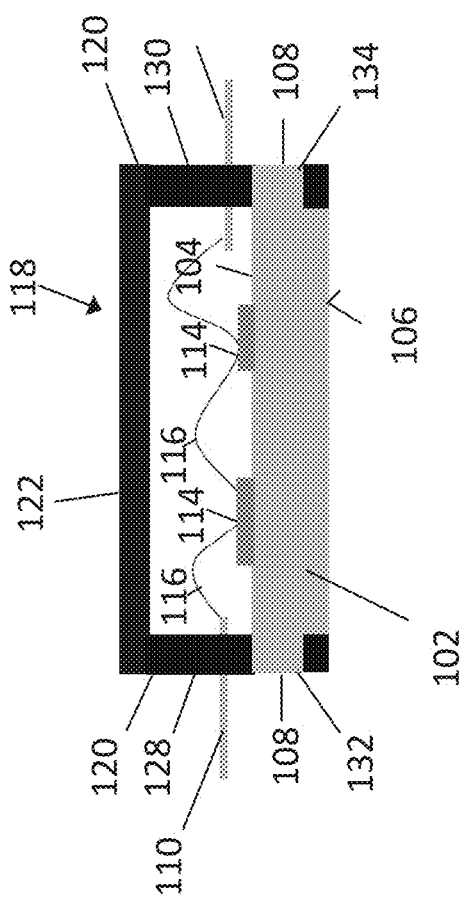
FIG. 18 illustrates a fourth method step for forming the semiconductor package described with reference to FIG. 3, according to an embodiment.

FIGS. 17-18 depict selected steps for forming the semiconductor device package 100 described with reference to FIG. 3, according to an embodiment.

Referring to FIG. 17, a heat slug 102 is provided. The heat slug 102 can be substantially similar or identical to the heat slugs 102 previously described in FIG. 3. The heat slug 102 depicted in FIG. 17A corresponds to the heat slug 102 previously described in FIG. 3B. The heat slug 102 depicted in FIG. 17B corresponds to the heat slug 102 previously described in FIG. 3C.

Referring to FIG. 18, the protective structure 118 is formed and/or provided on the heat slug 102. This can be done using any of the techniques described herein. For example, a pre-molded protective structure 118 with the first and second leads 110, 112 integrally formed in the outer walls 120 of the protective covering can be provided, e.g., in the manner described with reference to FIGS. 5-9, or, e.g., in the manner described with reference to FIGS. 14-16. Alternatively, a protective structure 118 can be molded directly onto the heat slug 102 using an in-situ molding process, e.g., in the manner described with reference to FIGS. 10-13.

Figure 19:
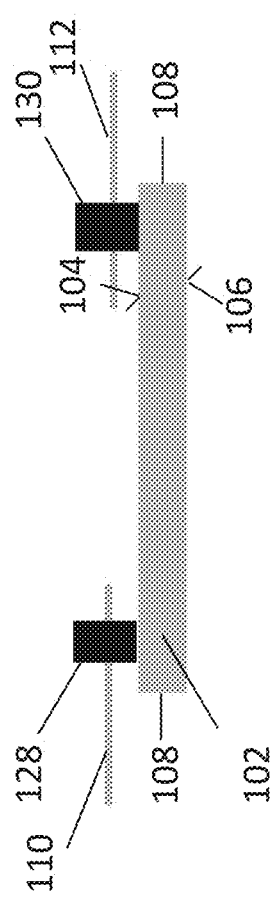
FIG. 19 illustrates a first method step for forming the semiconductor package described with reference to FIG. 4, according to an embodiment.
Figure 20:
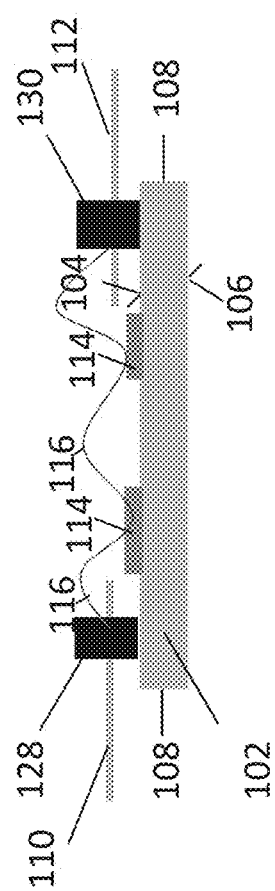
FIG. 20 illustrates a second method step for forming the semiconductor package described with reference to FIG. 4, according to an embodiment.
Figure 21:
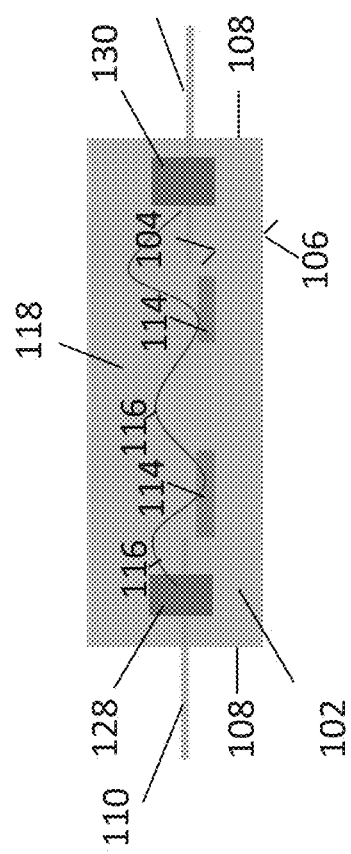
FIG. 21 illustrates a third method step for forming the semiconductor package described with reference to FIG. 4, according to an embodiment.

FIGS. 19-21 depict selected steps for forming the semiconductor device package 100 described with reference to FIG. 4, according to an embodiment.

Referring to FIG. 19, a heat slug 102 is provided. The heat slug 102 may be any of the heat slugs 102 described in the previously discussed embodiments. After providing the heat slug 102, the first and second fastening mechanisms 128, 130 are formed on the upper surface 104 of the heat slug 102. The first and second fastening mechanisms 128, 130 contain the first and second leads 110, 112. This can be done according to any of the techniques from the previously discussed embodiments.

Referring to FIG. 20, the semiconductor dies 114 are affixed to the upper surface 104 of the heat slug 102. This can be done according to the technique described with reference to FIG. 6, for example. Subsequently, the electrical connections 116 between the semiconductor dies 114 and the first and second leads 110, 112 are formed. This can be done according to the technique described with reference to FIG. 8, for example.

Referring to FIG. 21, a protective structure 118 is formed on the heat slug 102 after affixing the first and second discrete plastic columns on the upper surface 104 of the heat slug 102. Instead of an open air-cavity design, e.g., as disclosed in the embodiments described in with reference to FIGS. 1-3 and FIGS. 5-18, the protective structure 118 in FIG. 21 is formed as a solid structure that completely encapsulates the semiconductor dies 114 and the electrical connections 116. That is, the semiconductor dies 114 and the electrical connections 116 are enclosed such that the protective material directly contacts and encapsulates the semiconductor dies 114 and the electrical connections 116. During this process, the protective structure 118 is formed around the first and second fastening mechanisms 129, 130. According to one embodiment, the protective structure 118 includes a low-k dielectric material with a low loss tangent. The protective structure 118 can be formed according to any of a variety of known molding techniques. Examples of these molding techniques include injection molding, transfer molding, laminating, compression molding, etc.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of packaging a semiconductor device, comprising:
   providing a metal heat slug comprising an upper surface and lower surface;
   providing first and second electrically conductive leads;
   providing first and second non-metallic, electrically insulating fastening mechanisms;
   adhering the first and second non-metallic, electrically insulating fastening mechanisms directly to the upper surface of the metal heat slug in an outer peripheral region of the metal heat slug such that the first and second electrically conductive leads are vertically separated from and electrically insulated from the metal heat slug; and
   enclosing the semiconductor device with an electrically insulating protective structure having outer walls aligned with an edge of the outer peripheral region of the metal heat slug,
   wherein the outer peripheral region surrounds a die attach region of the metal heat slug, and
   wherein the die attach region is exposed from the first and second non-metallic, electrically insulating fastening mechanisms after adhering the first and second non-metallic, electrically insulating fastening mechanisms to the upper surface of the metal heat slug.

2. The method of claim 1, further comprising:
   providing a semiconductor die;
   affixing the semiconductor die to the die attach region;
   forming electrical connections between the semiconductor die and at least one of the first and second leads; and
   enclosing the semiconductor die and the electrical connections with the electrically insulating protective structure after adhering the first and second fastening mechanisms to the upper surface of the metal heat slug,
   wherein a geometry of the electrically insulating protective structure corresponds to an outer perimeter of the metal heat slug.

3. The method of claim 2, wherein the protective structure is a plastic structure comprising the outer walls and a roof section that extends between the outer walls, and wherein the semiconductor die and the electrical connections are enclosed within an air cavity between the protective structure and the metal heat slug.

4. The method of claim 3, wherein the first and second electrically insulating fastening mechanisms are provided by the outer walls of the protective structure, a first outer wall of the protective structure enveloping the first lead, a second outer wall of the protective structure enveloping the second lead, and wherein affixing the first and second leads to the metal heat slug comprises adhering the outer walls of the protective structure to the metal heat slug in the outer peripheral region.

5. The method of claim 4, wherein the first and second leads and the first and second fastening mechanisms are provided together by a pre-molded structure that includes the first lead integrally formed within the first outer wall and the second lead integrally formed within the second outer wall.

6. The method of claim 5, wherein the pre-molded structure has a ring shape with a corresponding geometry as the metal heat slug.

7. The method of claim 4,
   wherein the metal heat slug comprises: first and second outer edge sides that are opposite from one another, a first protrusion that extends away from the first outer edge side, and a second protrusion that extends away from the second outer edge side, and
   wherein the enclosing the semiconductor die and the electrical connections comprises affixing the outer walls of the protective covering to the first and second protrusions.

8. The method of claim 4, wherein the first and second leads and the first and second fastening mechanisms are provided separately, wherein the first and second leads are initially positioned over the upper surface of the metal heat slug,
   wherein the first and second fastening mechanisms are subsequently provided after the positioning of the first and second leads by molding the first and second outer walls of the protective structure directly onto the metal heat slug, and
   wherein the first outer wall is molded around the first lead and wherein the second outer wall is molded around the second lead.

9. The method of claim 8, wherein the electrical connections between the semiconductor die and at least one of the first and second leads are formed after molding the first and second outer walls.

10. The method of claim 8, further comprising providing a metal carrier that receives the metal heat slug with the lower surface of the metal heat slug being physically supported by a central portion of the metal carrier and with outer walls of the metal carrier extending past the upper surface of the metal heat slug, wherein the first and second leads are initially placed on the outer walls of the metal carrier before molding the first and second outer walls, and wherein the metal carrier is removed after molding the first and second outer walls.

11. The method of claim 3, wherein the first fastening mechanism comprises a first adhesive polymer support structure that is formed completely beneath the first lead, wherein the second fastening mechanism comprises a second adhesive polymer support structure that is formed completely beneath the second lead, and wherein enclosing the semiconductor die and the electrical connections comprises affixing the outer walls of the protective structure to upper sides of the first and second leads that are opposite from the first and second adhesive polymer support structures, respectively.

12. The method of claim 2, wherein the protective structure comprises a low-k dielectric material, and wherein the semiconductor die and the electrical connections are enclosed such that the low-k dielectric material directly contacts and encapsulates the semiconductor die and the electrical connections.

13. A method of packaging a semiconductor device, comprising:
providing a metal heat slug comprising an upper surface and lower surface;
providing first and second electrically conductive leads;
providing first and second non-metallic, electrically insulating fastening mechanisms; and
adhering the first and second non-metallic, electrically insulating fastening mechanisms directly to the upper surface of the metal heat slug in an outer peripheral region of the metal heat slug such that the first and second electrically conductive leads are vertically separated from and electrically insulated from the metal heat slug,
wherein the outer peripheral region surrounds a die attach region of the metal heat slug,
wherein the die attach region is exposed from the first and second non-metallic, electrically insulating fastening mechanisms after adhering the first and second non-metallic, electrically insulating fastening mechanisms to the upper surface of the metal heat slug,
wherein affixing the first and second electrically conductive leads to the metal heat slug using the first and second fastening mechanisms comprises affixing first and second discrete plastic columns on the upper surface of the metal heat slug, the first and second discrete plastic columns enveloping the first and second electrically conductive leads, respectively, and
wherein an electrically insulating protective structure is formed around the first and second discrete plastic columns after affixing the first and second discrete plastic columns on the upper surface of the metal heat slug.

14. A semiconductor device package, comprising:
a metal heat slug comprising an upper and lower surface;
first and second electrically conductive leads;
first and second non-metallic, electrically insulating fastening mechanisms that respectively affix the first and second electrically conductive leads to the metal heat slug such that the first and second electrically conductive leads are vertically separated from and electrically insulated from the metal heat slug; and
an electrically insulating protective structure configured to enclose the semiconductor device package, the electrically insulating protective structure having outer walls aligned with an edge of an outer peripheral region of the metal heat slug,
wherein the first and second non-metallic, electrically insulating fastening mechanisms are adhered directly to the upper surface of the metal heat slug in an outer peripheral region of the metal heat slug, the outer peripheral region surrounding a die attach region, and
wherein the die attach region is uncovered from the first and second non-metallic, electrically insulating fastening mechanisms.

15. The semiconductor device package of claim 14, further comprising:
a semiconductor die affixed to the die attach region of the metal heat slug;
electrical connections between the semiconductor die and at least one of the first and second leads; and
the electrically insulating protective structure encloses the semiconductor die and the electrical connections,
wherein a geometry of the electrically insulating protective structure corresponds to an outer perimeter of the metal heat slug.

16. The semiconductor device package of claim 15, wherein the protective structure is a plastic structure comprising outer walls and a roof section that extends between the outer walls, and wherein the semiconductor die and the electrical connections are enclosed by an air cavity between the roof section and the semiconductor die.

17. The semiconductor device package of claim 16, wherein the first non-metallic, electrically insulating fastening mechanism is provided by a first outer wall of the protective structure that envelops the first lead, wherein the second non-metallic, electrically insulating fastening mechanism is provided by a second outer wall of the protective structure that envelops the second lead.

18. A semiconductor device package, comprising:
a metal heat slug comprising an upper and lower surface;
first and second electrically conductive leads; and
first and second non-metallic, electrically insulating fastening mechanisms that respectively affix the first and second electrically conductive leads to the metal heat slug such that the first and second electrically conductive leads are vertically separated from and electrically insulated from the metal heat slug,
wherein the first and second non-metallic, electrically insulating fastening mechanisms are adhered directly to the upper surface of the metal heat slug in an outer peripheral region of the metal heat slug, the outer peripheral region surrounding a die attach region,
wherein the die attach region is uncovered from the first and second non-metallic, electrically insulating fastening mechanisms,
wherein the metal heat slug comprises: first and second outer edge sides that are opposite from one another, a first protrusion that extends away from the first outer edge side, and a second protrusion that extends away from the second outer edge side, wherein the first non-metallic, electrically insulating fastening mechanism is disposed on the first protrusion, and wherein the second non-metallic, electrically insulating fastening mechanism is disposed on the second protrusion, and
wherein outer walls of a protective structure and outer ends of the first and second protrusions are coextensive with one another.

19. The semiconductor device package of claim 16, wherein the first non-metallic, electrically insulating fastening mechanism comprises a first adhesive polymer support structure that is formed completely beneath the first lead, wherein the second non-metallic, electrically insulating fastening mechanism comprises a second adhesive polymer support structure that is formed completely beneath the second lead, and wherein the outer walls of the protective structure are affixed to upper sides of the first and second leads that are opposite from the first and second adhesive polymer support structures, respectively.

20. The semiconductor device package of claim 16, wherein the protective structure comprises a low-k dielectric material, and wherein the semiconductor die and the electrical connections are enclosed such that the low-k dielectric material directly contacts and encapsulates the semiconductor die and the electrical connections.

21. The semiconductor device package of claim 20, wherein the first non-metallic, electrically insulating fastening mechanism comprises a first plastic column that envelops the first lead, wherein the second electrically insulating fastening mechanism comprises a second plastic column that envelops the second lead, wherein lower sides of the first and second plastic columns are adhered to different locations on the outer peripheral region, and wherein the low-k dielectric material encloses the first and second plastic columns.

* * * * *